United States Patent [19]

Hatada et al.

[11] Patent Number: 5,195,576
[45] Date of Patent: Mar. 23, 1993

[54] LSI COOLING APPARATUS AND COMPUTER COOLING APPARATUS

[75] Inventors: Toshio Hatada, Tsuchiura; Hitoshi Matsushima, Ibaraki; Yoshihiro Kondou; Hiroshi Inoue, both of Ibaraki; Kanji Otsuka, Higashiyamato; Yuji Shirai, Kodaira; Takao Ohba; Akira Yamagiwa, both of Hadano, all of Japan

[73] Assignee: Hitachi, Ltd., Tokyo, Japan

[21] Appl. No.: 659,671

[22] Filed: Feb. 25, 1991

[30] Foreign Application Priority Data

Feb. 28, 1990 [JP] Japan ............................ 2-45413

[51] Int. Cl.$^5$ ................... F28F 7/00; H02B 1/56; H05K 7/20
[52] U.S. Cl. ............................ 165/80.3; 165/185; 361/383
[58] Field of Search ............... 165/80.2, 80.3, 185; 361/382, 383, 384

[56] References Cited

U.S. PATENT DOCUMENTS

| | | | |
|---|---|---|---|
| 3,232,344 | 2/1966 | Andersson et al. | 165/185 |
| 4,347,443 | 8/1982 | Whitney | 361/383 |
| 4,365,665 | 12/1982 | Nakamura | 165/80.3 |
| 4,730,233 | 3/1988 | Osterman | 361/383 |
| 4,851,965 | 7/1989 | Gabuzda et al. | 361/383 |
| 4,884,331 | 12/1989 | Hinshaw | 165/80.3 |
| 4,993,482 | 2/1991 | Dolbear et al. | 165/80.2 |

FOREIGN PATENT DOCUMENTS 1126079 9/1968 United Kingdom ............... 165/185
2146423 4/1985 United Kingdom ............... 165/80.3

OTHER PUBLICATIONS

P. W. Ing, "Parallel Air Cooling For Planar Package Devices", IBM Technical Disclosure Bulletin, Jun. 1971, vol. 14, No. 1, p. 181.
D. T. Follette et al., "Controlled Frontal Bypass Configuration For Air-Cooled Computer Frames", IBM Tech. Dics. Bulletin, Nov. 1978, vol. 21, No. 6, pp. 2432-2433.
R. G. Briskeborn et al., "Cooling Fin Structure", IBM Tech. Disc. Bulletin, Jul. 1982, vol. 25, No. 2, p. 618.

Primary Examiner—John Rivell
Assistant Examiner—L. R. Leo
Attorney, Agent, or Firm—Antonelli, Terry, Stout & Kraus

[57] ABSTRACT

An LSI cooling apparatus having various structures is used in electronic devices such as computer systems. In particular, the LSI cooling of apparatus is suitable for cooling of LSIs having high heat generating densities. In a cooling apparatus of the present invention, a heat sink is constructed to be small in pressure loss and excellent in cooling performance. This is because the heat sink comprises thin wire fins so set that the Reynold's number may not exceed 40. As a result, LSIs generating a large amount of heat can be cooled. Further, a heat sink having rigidity can be obtained by disposing wide-width wire drawn substances in thin wires or by using supports. Further, a computer comprising LSIs equipped with heat sinks can cope with various cooling air sending methods and it can be cooled with low noises.

5 Claims, 5 Drawing Sheets

THIN WIRE HAVING ROUND SHAPED SECTION

THIN WIRE HAVING ELLIPTICAL SECTION

THIN WIRE HAVING RECTANGULAR SECTION

Re ≈ 1

Re ≈ 30

Re > 40

LSI COOLING APPARATUS AND COMPUTER COOLING APPARATUS

BACKGROUND OF THE INVENTION

The present invention relates to LSI cooling apparatuses having various structures used in electronic devices such as computer systems and in particular to LSI cooling apparatuses suitable to cooling of LSIs having high heat generating densities.

As for cooling (air cooling) of LSIs in the past, they could be cooled by a simple structure mainly comprising a flat board because the heat generating density was several W/cm² or less at most. As the heat generated by LSIs increases in recent years, it has become necessary to pursue heat sink structures which are excellent in cooling performance. Among them, a heat sink structure taking the shape of pin fin is considered to be a desirable structure from the view point of advantages in mounting and improvement in heat radiation performance. An example using this structure is described on page 87 of Nikkei Electronics, Oct. 30, 1989. This pin fin structure itself is already known as a conventional technique. For largely improving the cooling performance, however, selection of dimension specifications of individual pins becomes extremely important. In the range of the prior art, however, there is a limitation in manufacturing and study of cooling performance is not sufficient. In this context, pins each having a diameter of 1 mmφ are used in most cases and flow of cooling air is not considered.

The heat sink structure of pin fin type has an advantage in that there are no restrictions upon the direction of cooling wind and another advantage of typically higher heat transfer performance (as compared with the flat board type). In case it is attempted to make full use of those advantages, however, an optimum structure design based upon a heat transfer phenomenon peculiar to the heat sink of pin fin type is demanded. That is to say, in a pin fin structure, not only the flow state but also the heat transfer characteristics change according to the pin diameter and the velocity of cooling air. Because of these phenomena, there exists a range of dimension specifications suitable for LSI cooling which is the subject of the present invention. In the prior art, however, the above described points are not considered.

SUMMARY OF THE INVENTION

A first object of the present invention is to provide a heat sink structure in the shape of thin wires suitable to a heat sink for LSI cooling which is small in pressure loss and excellent in cooling performance.

A second object is to provide a heat sink being rigid.

A third object is to provide a computer cooling apparatus which is excellent in cooling performance and low in noise.

In order to achieve the above described first object, a heat sink for LSI cooling according to the present invention comprises thin-wire (line) fins each having a wire diameter so set that the Reynold's number does not exceed 40. In case the flow velocity of cooling air is nearly 1 m/sec, for example, the heat sink comprises corrugated thin-wire fins having a wire diameter not larger than 0.6 mm, preferably equivalent to 0.3 mm.

In order to achieve the above described second object, a heat sink for LSI cooling according to the present invention is formed by disposing wide-width wire-drawn substances in the above described thin wires at appropriate intervals or by disposing supports and joining thin-wire fins to the supports.

In order to achieve the above described third object, a computer cooling apparatus of the present invention is so configured that the above described heat sink may be disposed on an LSI and cooling air may be let flow to an LSI package in the parallel direction or from above with Reynold's number of nearly 40 or less by means of a fan.

The present invention is based upon recognition of basic heat transfer characteristics of a thin-wire heat sink. That is to say, by taking out one thin wire and paying our attention to flow around it, we get patterns shown in FIGS. 11 to 13. The pattern of this flow is governed by Re (Reynold's number) which is a dimensionless number defined by a flow velocity V and a thin wire diameter D. Re is defined by the following equation.

$$Re = V \cdot D / \nu$$

where $\nu$ = coefficient of kinematic viscosity of the fluid.

As shown in FIG. 13, a break away exfoliation flow 15 occupies a very large proportion when $Re > 40$. As shown in FIG. 12, the exfoliation flow 15 exists but the region is limited when $Re \simeq 30$. Further as shown in FIG. 11, little exfoliation occurs in the flow when $Re \simeq 1$. This means that the pressure loss (ventilation resistance) increases by leaps and bounds when $Re > 40$. It has significant meaning as one selection condition to define Re so that $Re > 40$. In case wind is caused by a fan in LSI cooling, the wind velocity V is desired to be small as far as possible from the viewpoint of noise reduction and fan size reduction. If the wind velocity is reduced excessively, however, the wind temperature significantly rises, resulting in a limit. From such a point of view, $V = 1$ m/sec is nearly the minimum value in many actual cases. Therefore, the thin wire diameter D implementing $Re < 40$ when $V = 1$ m/sec becomes $D < 0.6$ mm. FIG. 14 shows the influence of the thin wire diameter (typical diameter) D on the pressure loss and heat transfer coefficient of a thin wire when $V \simeq 1$ m/sec. As the prior art, a case where $D \simeq 1$ mm is taken as an example and the diagram is shown by taking this as reference. As for the pressure loss first of all, the relation $Re > 40$ holds true when $D < 0.6$ mm as described above, resulting in significantly increased pressure loss. When $D < 0.6$ mm, it follows that $Re < 40$ and the proportion of the exfoliation flow gradually becomes small and the pressure loss gradually tends to become unchanged. On the other hand, the heat transfer coefficient has hitherto been grasped from the viewpoint of phenomenon. A knowledge that the heat transfer coefficient changes in inverse proportion to D as shown in FIG. 14 has already been obtained. The rate of increase becomes large especially when $D < 0.6$ mm.

The present invention has been devised on the basis of phenomenon study with respect to basic heat transfer characteristics heretofore described and a restriction condition for an LSI cooling heat sink. As compared with the prior art, significant increase in cooling performance can be realized. That is to say, the essential point of the present invention is that the typical diameter D of linear substances serving as main elements of a heat sink is defined as $D < 0.6$ mm, for example, so that the Reynold's number may not exceed 40.

Further, by disposing wide-width wire-drawn substances in thin wires at adequate intervals, they serve as supports and the rigidity can be improved.

Further, by disposing the above described heat sink on an LSI package and sending air by means of a fan so that the Reynold's number may not exceed 40, it is possible to send air from all directions and limit occurrence of aireddy to a small value, and hence it is possible to provide a computer cooling apparatus which is low in noise.

DESCRIPTION OF THE PREFERRED EMBODIMENTS

An embodiment of the present invention will now be described by referring to FIGS. 1 to 16.

Figure 1:
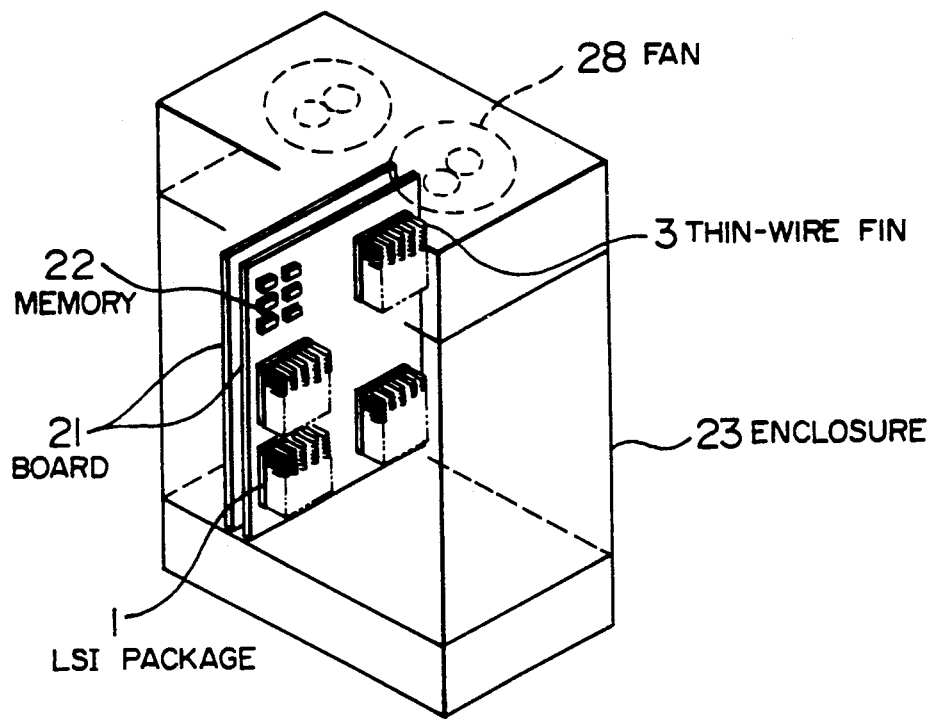
FIG. 1 is an oblique view showing the mounting state of the case where an embodiment of the present invention is applied to a computer.

FIG. 1 is an oblique view showing the mounting state of a computer comprising boards (substrates) having LSIs equipped with heat sinks mounted thereon and means for air-cooling the LSIs according to an embodiment of the present invention.

A computer 30 comprises a plurality of boards 21 mounted in an enclosure 23 and interconnected. Memories 22 and LSI packages 1 are mounted on each board 21. Each LSI package 1 comprises thin-wire fins 3 forming a heat sink according to an embodiment of the present invention. A fan 28 for flowing a fluid on the LSI packages 1 to cool them is mounted on the top face of the enclosure 23. (However, the fan 28 may be mounted on a face of the enclosure 23 other than the top face.)

Hereafter, description will be made by taking air as an example of the fluid.

Figure 2:
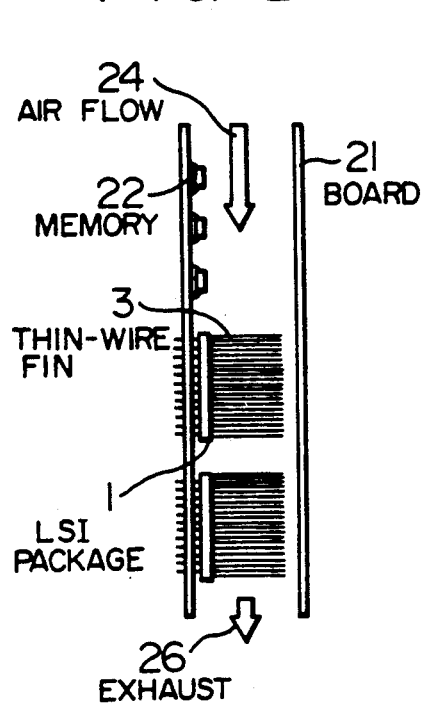
FIGS. 2 and 3 are longitudinal section diagrams of a board section respectively showing flows of cooling air.
Figure 3:
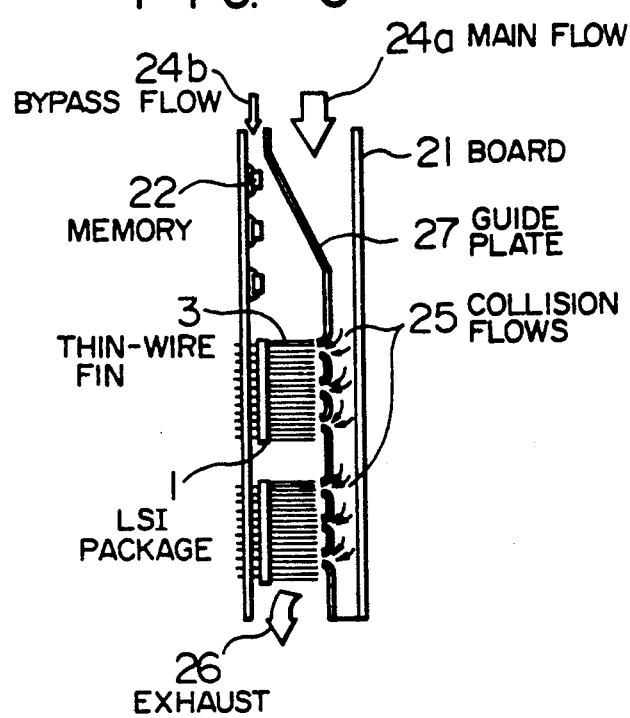

As for the method for sending cooling air by using the fan 28, one of methods exemplited in FIGS. 2 and 3 is taken. The air sending method shown in FIG. 2 uses parallel flows, whereas the air sending method shown in FIG. 3 uses collision flows. In addition, many variations of the air sending method can be coped with.

When the air sending method illustrated in FIG. 2 is used, cooling air generated by the fan 28 is guided by boards 21 to flow between the boards 21 as an air flow 24. The cooling air flows and cools the memories 22 and passes between the thin-wire fins 3, which form a heat sink, and deprives the LSI packages 1 of heat as described later in detail to cool an LSI package located behind the LSI package 1. Thereafter the cooling air is exhausted as denoted by 26.

When the air sending method shown in FIG. 3 is used, there is provided a guide plate 27 having a slit for introducing cooling air between the boards 21 from above the LSI packages 1. The cooling air is divided into a main flow 24a and a bypass flow 24b and then sent to the LSI packages 1. Out of the cooling air sent by the fan 28, the bypass flow 24b cools the memories 22. On the other hand, the main flow 24a passes through the slit formed in the guide plate 27 and collides with the thin-wire fins 3 and the LSI packages 1 from above the LSI packages 1 as a collision flow to cool them. While being mixed with the bypass flow 24b, the main flow 24a is exhausted as indicated by 26.

The detailed structure of the heat sink of LSI package 1 will now be described by referring to FIGS. 4 to 14.

Figure 4:
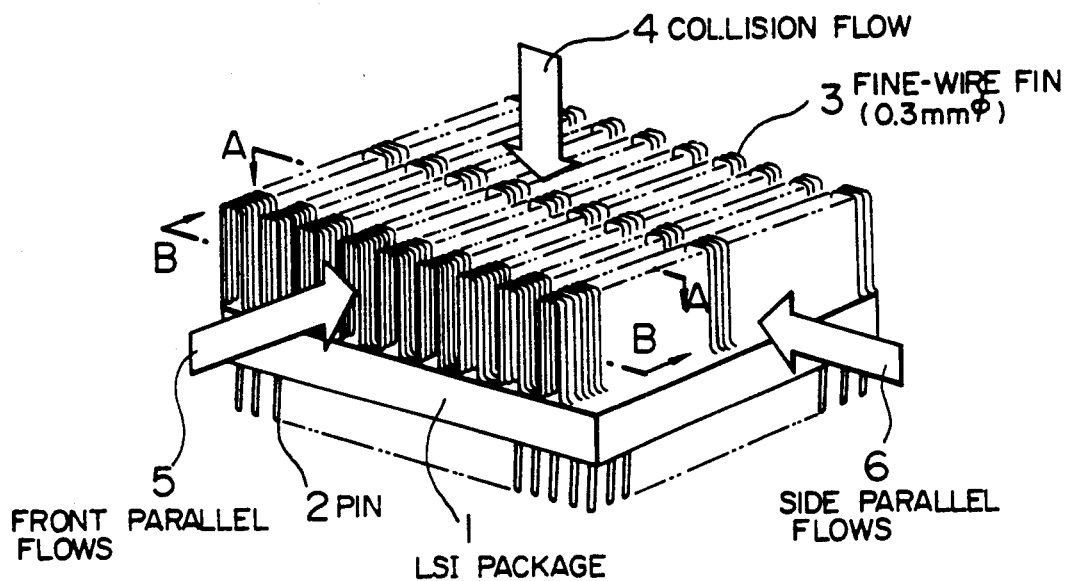
FIG. 4 is an oblique view showing the structure of a heat sink of one LSI package.
Figure 5:
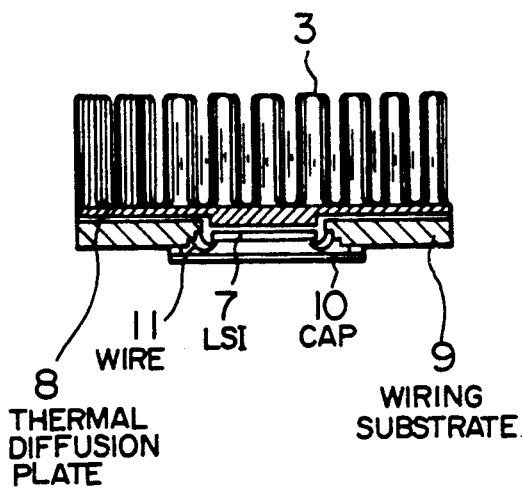
FIG. 5 is a sectional view seen along A—A of FIG. 4.
Figure 6:
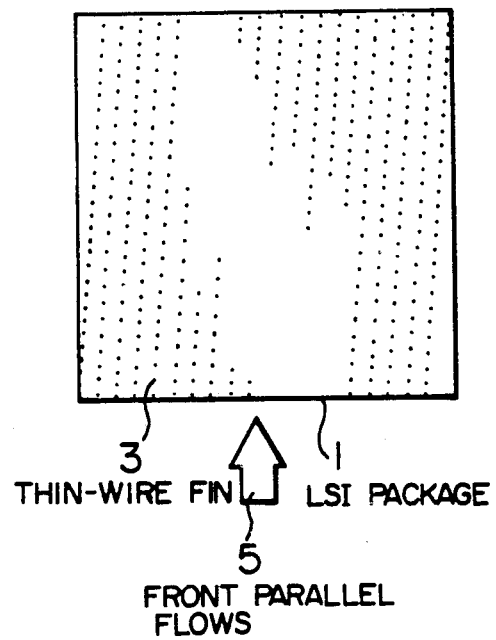
FIG. 6 is a sectional view seen along B—B of FIG. 4.

FIG. 4 shows an example of mounting of a cooling heat sink on one LSI package. In the structure of the present embodiment, fine-wire fins 3 each having a diameter of 0.3 mm$\phi$ and forming a cooling heat sink are mounted on the LSI package. The thin-wire fins 3 are formed by bending parallel fine wires, which would become long continuous wires when stretched, so as to be corrugated. From the bottom face of the LSI package 1, a large number of pins 2 communicating with an internal wiring substrate are projected. As for the direction of the cooling air for cooling the above described LSI package, the heat sink can be cooled from any direction as indicated by 4 to 6. As for the detailed structure such as attachment of the thin-wire fins 3, the thin-wire fins 3 are joined directly with a thermal diffusion plate 8 disposed on the top face of the above described package as shown in FIG. 5 which is a sectional view seen along a line A—A of FIG. 4. Since the heat sink structure comprises thin wires, the thermal diffusion plate 8 can be joined directly with the thin-wire fin 3 (by means of metallic joining, for example) and it is not necessary to sandwich an elastic member between them. The package comprises an LSI chip 7, a wiring substrate 9, a wire 11 and a cap 10. They are joined each other by suitable binding materials such as Si rubber. The LSI chip 7 and the pin 2 are electrically connected by a wire 11 and guarded by a cap 10. Further, the thermal diffusion plate 8 functions to transfer heat generated by the LSI chip 7 to the thin-wire fins 3. Further, the thin-wire fins 3 are so arranged that thin-wire rows are inclined with respect to the direction of the front parallel flows 5 as shown in FIG. 6 which is a sectional view seen along a line B—B of FIG. 4.

Figure 7:
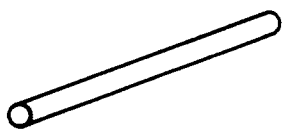
FIGS. 7 to 9 are oblique views respectively showing shapes of thin-wire fins.
Figure 8:
Figure 9:

The sectional shape of thin wires is not limited to a roundshape as shown in FIG. 7, but may be an ellipse as shown in FIG. 8 or a rectangle as shown in FIG. 9. It is important that the representative length represented as [2×minimum diameter×maximum diameter/(minimum diameter+maximum diameter)] is so set as to be 0.6 mm or less.

In the present embodiment, the thin wire diameter is defined as D=0.3 mm.

It is a matter of course that the direction of air flow can be controlled by combining different sectional shapes.

Figure 10:
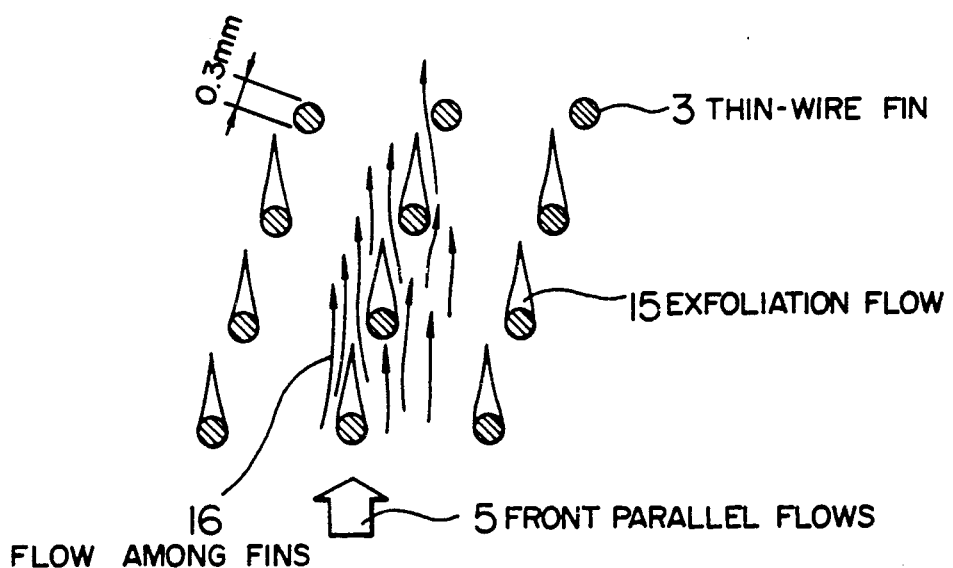
FIGS. 10 to 13 are diagrams respectively showing air flow states.
Figure 11:
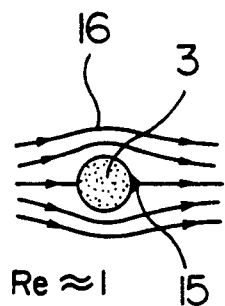
Figure 12:
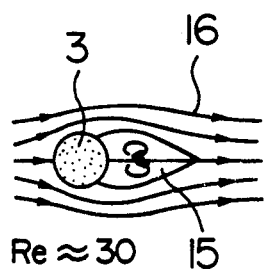
Figure 13:
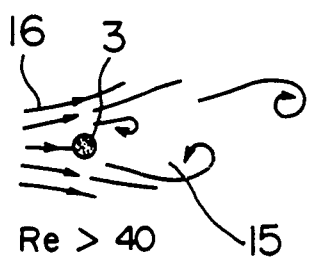
Figure 14:
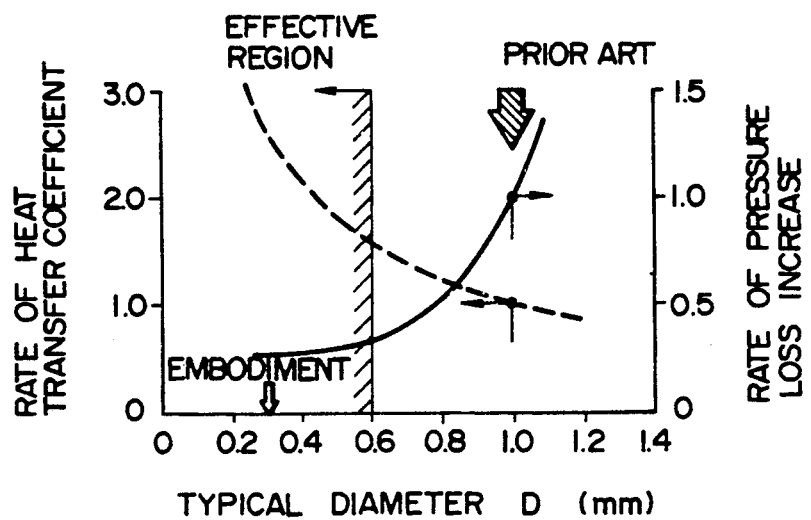
FIG. 14 is a diagram for explaining the effect of the present invention.

The operation and effect of the present embodiment will now be described. In the thin-wire fin of the present embodiment, the thin wire diameter is defined as D=0.3 mm as described above. In case the air velocity V=1 m/sec, therefore, the Reynold's number Re becomes Re=20 and the slip stream of the thin wire, i.e., the region in which the exfoliation section 15 of flow is formed remains comparatively small. As a result, the pattern of air flow among thin wires is smooth as shown in FIG. 10. First of all, the pressure loss is held down to a very small value as evident from heat transfer fluidity characteristics shown in FIG. 14. Further, in case of the present embodiment, the thin-wire rows are inclined with respect to the front parallel flows 5. As shown in FIG. 10, therefore, the influence of the slip stream (exfoliation flow 15) of a thin wire is not exerted upon a thin wire of a rear row in the direction of the flow. This point is extremely favorable in giving full play to the heat transfer coefficient (i.e., cooling performance) of individual thin wires. As evident from characteristics of FIG. 14 as well, the heat transfer coefficient is largely improved. In case the thin-wire row is inclined as described above, the best state is obtained. As other variations of row arrangement, a zigzag form and a checkers form can be mentioned. By using a thin-wire heat sink according to the present embodiment as heretofore described, the cooling performance can be largely improved as compared with the prior art while limiting the pressure loss of cooling air to a small value.

Figure 15:
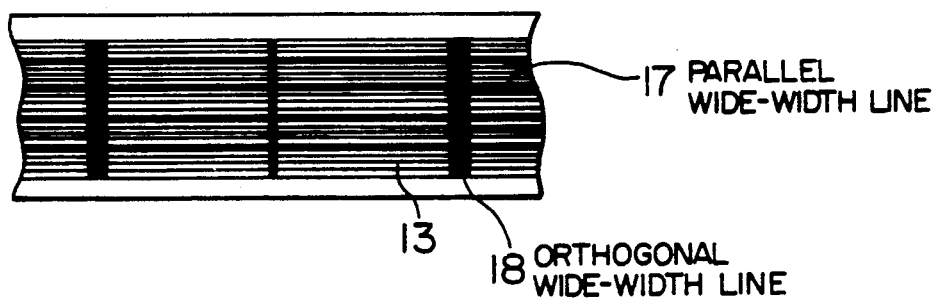
FIG. 15 is a plan view showing another embodiment of the present invention.
Figure 16:
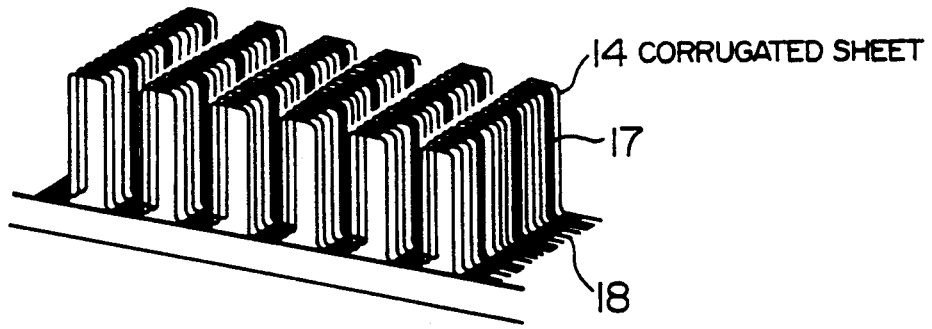
FIG. 16 is an oblique view showing the structure of a heat sink on one LSI package thereof.

Another embodiment of the present invention is shown in FIGS. 15 and 16.

In the present embodiment as well, the main point is that thin lines with D<0.6 mm are provided. In implementation, however, new functions can be added by adding different components. As one of them, strengthening rigidity of the heat sink can be added. That is to say, wide-width linear substances 17 and 18 are inserted in appropriate places among thin wires. As a result, the strength of the linear heat sink in the longitudinal and lateral directions can be largely improved. Orthozonal wide-width linear substances 18 included in the wide-width linear substances 17 and 18 are positioned at junctions of thin-wire fins 3 so bent as to be corrugated with the thermal diffusion plate 8 and at the upper ends of the thin-wire fins 3. Further, parallel wide-width linear substances 17 may be disposed at suitable intervals. By doing so, a heat sink which is robust in strength can be obtained although the ventilation resistance increases slightly.

Figure 17:
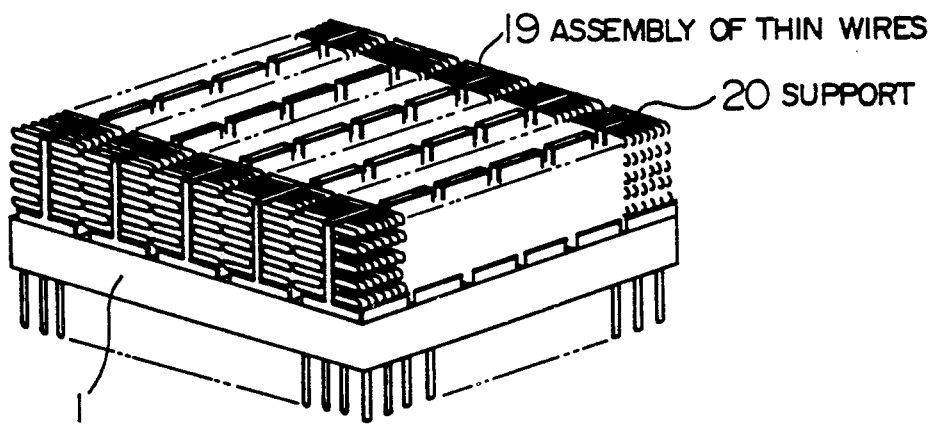
FIG. 17 is an oblique view showing the structure of a heat sink which is another embodiment of the present invention.
Figure 18:
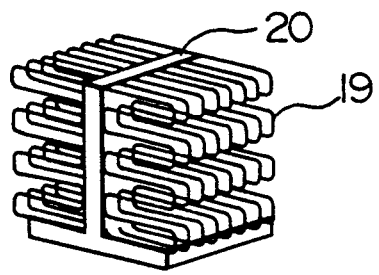
FIG. 18 is an enlarged view of a part of the structure shown in FIG. 17.

Another embodiment of the present invention is shown in FIGS. 17 and 18.

The heat sink having a structure of the present embodiment aims at improving the degree of freedom in heat sink size and improving the handling property. In the present embodiment, one element comprises an assembly 19 of thin wires stuck to a support 20 having an arbitrary size as shown in FIG. 18. By using a plurality of such elements, a whole heat sink is fabricated as shown in FIG. 17.

In the same way as the foregoing description, the thin-wire assembly 19 is joined directly to the support 20 by metallic joining or the like. By doing so, the strength of the heat sink can be largely improved although the direction of cooling air flow is restrained.

In case it is desirable to obtain a degree of freedom of cooling air flow direction, an adequate number of ventilation holes may be disposed in each of the supports 20. In the embodiments heretofore described, the thin-wire fins are joined directly to the thermal diffusion plate 8 or the support 20. However, in direct joining may be used instead.

In some cases, an LSI cooling heat sink includes a side plate for a carved seal such as trade mark. As a matter of course, the present invention allows appropriate addition of those additional members.

Owing to the present invention, firstly, a heat sink which is small in pressure loss and excellent in cooling performance can be constructed because the heat sink comprises thin-wire fins so set that the Reynold's number may not exceed 40. As a result, LSIs generating a large amount of heat can be cooled. Secondly, a heat sink having rigidity can be obtained by disposing wide-width linear substances in thin wires or by using supports. Thirdly, a computer comprising LSIs equipped with heat sinks of the present invention can cope with various cooling air sending methods and it can be cooled with low noises.

What is claimed is:

1. An LSI cooling apparatus for cooling LSIs by flowing a fluid through heat sinks attached to the LSIs, each of said heat sinks comprising a group of a plurality of thin-wire fins,
    said group of thin-wire fins being aligned in parallel with each other in a plane and being bent in a corrugated shape,
    said group of thin wire fins including a plurality of wide-width members, each of the wide-width members having a cross section of a width wider than a width of the thin-wire fins,
    each of said wide-width member being disposed at a predetermined interval from another wide-width member.

2. An LSI cooling apparatus according to claim 1, wherein a sectional shape of each of said thin-wire fins is selected from the group consisting of a circle, an ellipse, and a rectangle.

3. An LSI cooling apparatus according to claim 1, wherein,
    a diameter of a thin-wire fin of the tin-wire fins, a fluid sending rate of the flow corresponding to a passage of fluid for guiding the flow are such that a Reynold's number defined by $$Re = \frac{V \cdot d}{v}$$

is less than 40, wherein d is the diameter of the wire, V is the flow velocity of the fluid flowing through said heat sinks and $v$ is the coefficient of kinematic viscosity of the fluid.

4. An LSI cooling apparatus according to claim 3, wherein said diameter of the thin wire is less than 0.6 mm.

5. A computer cooling apparatus, comprising:
    a board including plural LSI packages, said LSI packages having heat sinks;
    air sensing means for sending air to cool said LSI packages through an air passage of the air sending means,
    each of said heat sinks including thin-wire fins, the diameter of a thin wire of the thin wire fins, and the air sending rate being so set as to yield a Reynold's number less than 40,
    wherein said air passage includes a guide plate for dividing air into a main flow and a bypass flow and said main flow is guided by a slit formed in said guide plate so that the main flow collide with a portion of said LSI packages from above whereas a remaining portion of said LSI packages are adapted to be cooled by said bypass flow.

* * * * *